United States Patent [19]

Sevenhans et al.

[11] Patent Number: 5,191,545
[45] Date of Patent: Mar. 2, 1993

[54] INTERPOLATOR INCREASING THE OUTPUT WORD RATE OF A DIGITAL SIGNAL

[75] Inventors: Joannes M. J. Sevenhans, Brasschaat; Lajos Kiss, Wilrijk, both of Belgium

[73] Assignee: Alcatel N.V., Amsterdam, Netherlands

[21] Appl. No.: 759,449

[22] Filed: Sep. 13, 1991

[30] Foreign Application Priority Data

Sep. 18, 1990 [EP] European Pat. Off. ......... 90870153.5

[51] Int. Cl.$^5$ .............................................. H04J 3/22
[52] U.S. Cl. ............................... 364/723; 370/84
[58] Field of Search ............... 370/84; 364/723, 724.1

[56] References Cited

U.S. PATENT DOCUMENTS

| 4,006,314 | 2/1977 | Condon et al. | 370/100.1 |
| 4,109,110 | 8/1978 | Gingell | 395/2 |
| 4,270,026 | 5/1981 | Shenoi et al. | 341/61 |

FOREIGN PATENT DOCUMENTS 0234666 of 0000 European Pat. Off. .

Primary Examiner—Douglas W. Olms
Assistant Examiner—Russell W. Blum
Attorney, Agent, or Firm—Ware, Fressola, Van Der Sluys & Adolphson

[57] ABSTRACT

A multiplex interpolator handles 4 series of multibit input words ..., $S_i$, $S_{i+1}$, ... applied in parallel at 32 kHz after conversion through an input series to parallel converter (SIPO) and produces 4 series of multibit output words at 256 kHz with the help of a parallel adder/-subtractor (ADD) operated in multiplex to compute successively for each of the 4 series of input words, the output words $8S_i$, $7S_i+S_{i+1}$, ..., $S_i+7S_{i+1}$, $8S_{i+1}$, ..., each addition of $S_{i+1}-S_i$ being also computed by the adder/subtractor in two steps, first by subtracting (c1) $S_i$ from the accumulated (IVC) value and second, by adding (d1) $S_{i+1}$ to the newly accumulated value, the adder/subtractor being initialized after each pair of steps prior to processing data pertaining to another of the 4 input words in a cyclic manner.

13 Claims, 3 Drawing Sheets

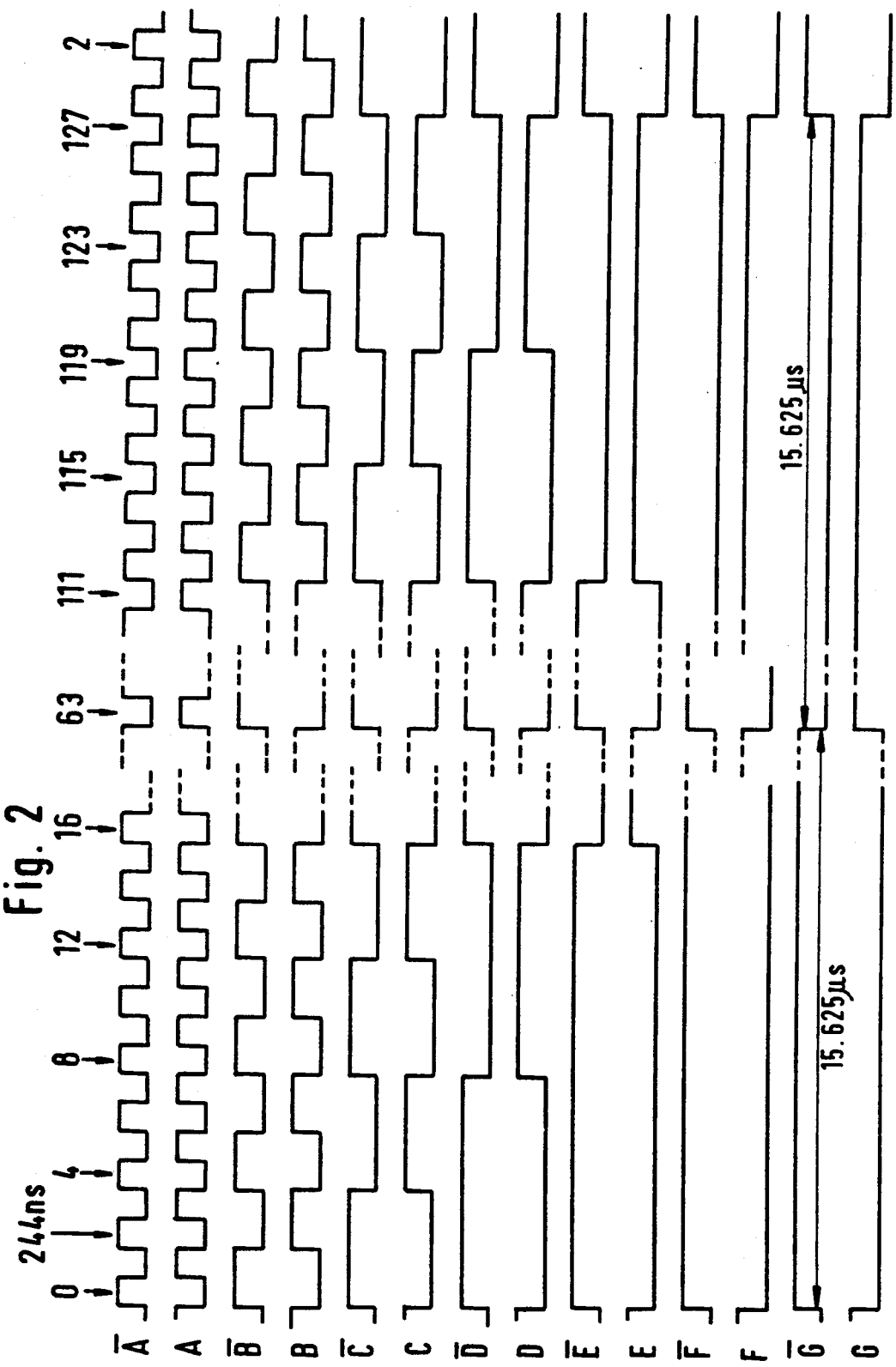

Fig. 3

| | a | b/e | c | d | f | g |
|---|---|---|---|---|---|---|
| INP 1 | $\bar{A}\bar{B}\bar{C}\bar{D}\bar{E}F\bar{G}$ | $\bar{A}\bar{B}\bar{C}\bar{D}\bar{E}F\bar{G}$ | $\bar{A}B\bar{C}\bar{D}$ | $AB\bar{C}\bar{D}$ | $B\bar{C}\bar{D}$ | $B\bar{C}\bar{D}$ |
| | v0 | u0 | u2,18,34,50, 66,82,98,114 | u3,19,35,51, 67,83,99,115 | u2,3,18,19, 98,99,114,115 | v2,3,18,19, 98,99,114,115 |
| INP 2 | $\bar{A}\bar{B}\bar{C}\bar{D}\bar{E}F\bar{G}$ | $\bar{A}\bar{B}\bar{C}\bar{D}\bar{E}F\bar{G}$ | $\bar{A}B\bar{C}D$ | $AB\bar{C}D$ | $B\bar{C}D$ | $B\bar{C}D$ |
| | v32 | u32 | u6,22,38,54, 70,86,102,118 | u7,23,39,55, 71,87,103,119 | u6,7,22,23, 102,103,118,119 | v6,7,22,23, 102,103,118,119 |
| INP 3 | $\bar{A}\bar{B}\bar{C}\bar{D}\bar{E}F\bar{G}$ | $\bar{A}\bar{B}\bar{C}\bar{D}\bar{E}F\bar{G}$ | $\bar{A}B\bar{C}\bar{D}$ | $AB\bar{C}\bar{D}$ | $\bar{B}C\bar{D}$ | $\bar{B}C\bar{D}$ |
| | v64 | u64 | u10,26,42,58, 74,90,106,122 | u11,27,43,59, 75,91,107,123 | u10,11,26,27, 106,107,122,123 | v10,11,26,27, 106,107,122,123 |
| INP 4 | $\bar{A}\bar{B}\bar{C}\bar{D}\bar{E}F\bar{G}$ | $\bar{A}\bar{B}\bar{C}\bar{D}\bar{E}F\bar{G}$ | $\bar{A}BCD$ | $ABCD$ | $BCD$ | $BCD$ |
| | v96 | u96 | u14,30,46,62, 78,94,110,126 | u15,31,47,63, 79,95,111,127 | u14,15,30,31, 110,111,126,127 | v14,15,30,31, 110,111,126,127 |

INTERPOLATOR INCREASING THE OUTPUT WORD RATE OF A DIGITAL SIGNAL

BACKGROUND OF THE INVENTION

1. Field of the Invention

The present invention relates to an interpolator increasing the output word rate of a digital signal by interleaving words between successive input words..., Si, Si+1, ..., the values of the interleaved output words depending on the difference between successive input words.

2. Description of the Prior Art

An interpolator of this type, which may be used in telephone line circuits, is included for instance as one of those part of the converter circuit disclosed in the European patent application published under No. 0234666 (P. Reusens et al 1-1), i.e. that immediately preceding a digital sigma-delta modulator. Basically, this particular interpolator receives 17-bit words at 32 kHz, these being rounded to 16-bit at the input of the interpolator which outputs words at $8 \times 32 = 256$ kHz by repeatedly storing the difference between two successive input words Si and Si+i in a hold register for a sampling period of $1000/32 = 31.25$ microsecond and outputting linearly incremented words Si+(Si+1−Si)/8, Si+2-(Si+1−Si)/8,..., Si+8(Si+1−Si)/8 = Si+1 whereafter the difference Si+1−Si is replaced by that between the next pair, i.e. Si+2−Si+1. In principle, this linear interpolation involves a digital integrator with an input adder fed by (Si+1−Si)/8 at its first input and by the interpolator output Si, Si+(Si+1−Si)/8, ... at its second input. The first input receives (Si+1−Si)/8 from Si+1−Si stored in the hold register due to the bits being shifted by 3 stages in a shift register, this division by 8 also converting the 16-bit into 19-bit words by the addition of 000 as Most Significant Bits of the words. The second input receives the successive interpolator output words Si, Si+(Si+1−Si)/8, ... through a delay circuit of $1000/(32 \times 8) = 3.90625$ microsecond corresponding to the 256 kHz output rate, i.e. one eighth of the sampling period. Every 31.25 microsecond, a sampling gate connects the output to an adder preceding the hold register and receiving the input words at its other input so that Si+2−Si+1 can replace Si+1−Si in the register. Operations are algebraic since Si+1−Si as well as Si, Si+1 can be positive or negative binary numbers.

Such a straight line interpolator where the increment is also obtained by division, using delay and recirculation circuits, was already disclosed in U.S. Pat. No. 4109110 (M. Gingell 12). As opposed to inserting N−1 words equal to the previous input word between the latter and the next, this was noted to double the attenuation (with peaks at the sampling frequency and all its harmonics), i.e. an equivalent spectrum filtering of G2 where  indicates that the preceding value is to be raised to the succeding exponent and where $$G=(1-z^{}(-N))(1-z^{}(-1))^{**}(-1)$$

This G value for the insertion of N−1 equal samples was indicated to correspond to the insertion of N−1 zero value samples followed by digital filtering at N times the sampling frequency.

In practice, the incrementation implying divisions of multibit numbers, means must be found to carry this out in an efficient manner and in that particular interpolator disclosed in the U.S. Pat. No. 4270026 (K. Shenoi et al 3-3) which uses a low pass digital recursive filter with integral powers of 2 for its coefficients one can perform divisions by integral powers of 2 without resorting to multibit multipliers. That interpolator operates at a much higher relative speed since the words received at 32 kHz are first loaded in parallel into an accumulator from which they are extracted by strobe pulses at $32 \times 32 = 1024$ kHz but with the 32 output words during each period of 31.25 microsecond including 3 zero words interleaved after each of the 8 words corresponding to the stored input word. The recursive filter fed with such output words includes dividers by 16 and 32 as part of the circuits needed to provide a suitable filter output at $32 \times 8 = 256$ kHz. Both dividers, that by 32 immediately preceding the filter output, are part of the recursive filter designed to provide at its output a suitably filtered signal at an increased word rate with those interleaved zero words between the last version of a repeated input sample and the first version of the next repeated input sample now being suitable interpolated values. The divisions by 16 and 32 may occur by shifting the binary words in the shift registers by 4 and 5 stages respectively and in order to avoid the complexities of divisions producing quotients with fractional parts, the recursive filter uses dividers storing the 4 and 5 Least Significant Bits remainders which are subsequently added to the next word to be divided. Indeed, this approximation technique was shown to give sufficiently accurate results, i.e. noise spectrum reshaping. Such dividers thus imply that the 16-bit input words become respectively 12 and 11-bit words at the output of the respective divider, due to the 4 and 5 LSB being saved for the next division, and with a recursive filters these 12 and 11 MSB are both fed back to the input of the filter for subtraction from the 16-bit input words.

The above binary division technique need not be restricted to interpolators involving recursive filter (with feedback) since instead of such Infinite Impulse Response filters, Finite Impulse Response or transversal filters avoided in the above US patent can also be used as disclosed in the IEEE Journal of Solid-State Circuits, Vol. SC-20, No 3, June 1985, p. 679 to 687. Therein, starting from Pulse Code Modulation words received at 8 kHz, first one interpolates to 32 kHz by duplicating each input word and each time interleaving a zero word between two successive input words, low pass filter sections following this to feed further cascaded interpolators to reach a 256 Khz and finally a 1024 kHz rate. While this last is obtained by a 4-tap rectangular window realized by oversampling, the intermediate interpolation from 32 to 256 Khz again involves divisions by integral powers of 2. This is achieved by a triangular window FIR filter built around a 16-bit accumulator clocked at 1 MHz (1024 kHz) and, as in the above European application, the difference between the input and output words is latched into a hold register. The 16-bit word stored during 31.25 microsecond is divided by 64 and then integrated at 256 kHz. As in the above US patent, the 6 LSB constituting the remainder of the division by 64 are saved for the next division of the stored 16-bit word while the 10 MSB are integrated at 256 Khz to produce 13-bit words due to the difference in input and output rates. In addition to the 13-bit words being repeated 4 times by the 4-point rectangular window FIR filter constituting the third cascaded interpolator, in the second, every 8 output samples these 13-bit words are fed back to the input, this at the 256/8=32 kHz rate to be subtracted from the input word so that a new increment can be stored in the hold register. The feedback circuit includes a shift register whereby these 13-bit words can be shifted by 3 stages to produce 16-bit words after a multiplication by 8. This operation is performed in a cycle distinct from that used to add the 6 LSB remainder (fractional) part to the next 16-bit word to be divided by 64 since the accumulator is only 16 bit wide Thus, the interpolator defined at the beginning of this description can be built in a variety of ways relying on binary divisions but while the complexity of these can be advantageously reduced, as disclosed in the above U.S. Pat. No. 4,270,026, nevertheless the circuitry is still relatively complex, e.g. the IIR filter of this U.S. patent.

SUMMARY OF THE INVENTION

The general object of the invention is to simplify the structure of such an interpolator by avoiding any divisions, even those binary divisions circumventing fractional parts as in the above U.S. patent.

In accordance with a first feature of the invention, the successive input words ..., $S_i$, $S_{i+1}$, ... feed a memory to store two consecutively applied input words $S_i$ and $S_{i+1}$ as well as multiplier means producing successively the words ..., $nS_i$, $nS_{i+1}$, ... where n is the multiplication factor, and the interpolator further includes an adder/substractor repeatedly operated N times during the period of time each pair of words $S_i$ and $S_{i+1}$ is stored to feed the output words into an accumulator initially storing $nS_i$ provided by the multiplier means, the adder/subtractor inputs being fed by the output word in the accumulator and by words which are such predetermined functions of $S_i$ and $S_{i+1}$ in the memory that after the N repeated operations $nS_{i+1}$ is fed into the accumulator by the adder/subtractor.

In this way, by changing the scale at which the output words are generated, there is no longer a need for a division, e.g. in order to obtain the incremental values used to produce the words interpolated between $S_i$ and $S_{i+1}$ which are now directly obtained, at an enlarged scale.

With the avoidance of corrected truncated divisions as in the above U.S. Pat. No. 4,270,026 and which create noise, shaping the latter is no longer necessary and the frequency response simply corresponds to that of a rectangular window of period T, i.e. sin fT/fT which since function is 0 for f=1/T, e.g. 32 kHz, and all integral multiples of 1/T. Assuming by way of example the case of a simple linear interpolation as well as of n−1 interpolated words $S_j$(j=1, 2, ..., n−1) so that N=n, these are defined by the iterative formula $nS_j = nS_{j-1} - S_i + S_{i+1}$ with $S_{j-1} = S_i$ for j=1 and $S_j = S_{i+1}$ for j=n. Thus, starting from $nS_i$, the repeated subtraction of $S_i$ and addition of $S_{i+1}$ will successively produce the interpolated words (n−1)$S_i+S_{i+1}$, (n−2)$S_i+2S_{i+1}$, ... from the previous ones until the n th iteration stores $nS_{i+1}$ into the accumulator.

Another object of the invention is to reduce the amount of circuitry needed to achieve the above interpolator functions when a plurality of independent successions of input words are to be processed to produce a like plurality of corresponding independent output words.

In accordance with a second feature of the invention, a plurality p of interpolators as characterized above are associated in time division multiplex fashion in such a way that each period during which the adder/substractor is operated N times is divided into p consecutive time intervals each of with being used to feed the corresponding p memories and the p multiplier means, and that each such period is also divided into N consecutive time intervals and which each of these being further divided into p consecutive time intervals each of the pN time intervals being used to operate the adder/subtractor after its initialization to produce the corresponding one of the N output words for the corresponding one of the p interpolators.

Such a multiplex technique for independent data sources combined with the interpolator as previously characterized is particularly efficient, not only in limiting the circuits since it leads the way f.i. to a parallel adder/subtractor used in multiplex with its stages split in a bit slice structure, but in restricting the highest clock frequency to a minimum value as the input words from the p interpolators can be continuously introduced serially on an interleaved basis while the computations at higher speed are also interleaved for the p words. For p=4, n=N=8 and input words at 32 kHz f.i., leading to the multiplex interpolator outputting at 256 kHz, the highest clock frequency to perform all computations can be restricted to 4096 kHz or only 4 times the product of the number (p) of independent data input sources by the output frequency for the corresponding interpolated words. In the corresponding clock period of 1000/4.096=244 nanoseconds only two non-overlapping strobe pulses with a 50% duty cycle to produce a 2-phase clock system are necessary. This highest clock frequency of 4 MHz for the 4 multiplexed interpolators is also only 4 times the input word frequency of the single interpolator of the above U.S. Pat. No. 4,270,026, a clock frequency of 1 MHz being also used for the single interpolator of the above article. To be noted that this U.S. patent includes a variant to implement the recursive filter by a multiplexed arithmetic logic circuit but not only is this alternative embodiment still restricted to a single interpolator but the sample interval of 1 microsecond has to be divided into at least 6 time slots with 2-phase strobe pulses.

DESCRIPTION OF THE DRAWINGS

The above mentioned and other objects and features of the invention will become more apparent and the invention itself will be best understood by referring to the following description of an embodiment taken in conjunction with the accompanying drawings which represent:

FIG. 2, waveforms of pulses used to control the interpolator of FIG. 1; and

FIG. 3, a table indicating the timing of operation of various gates used in FIG. 1 by the pulses of FIG. 2.

DETAILED DESCRIPTION OF THE INVENTION

Figure 1:
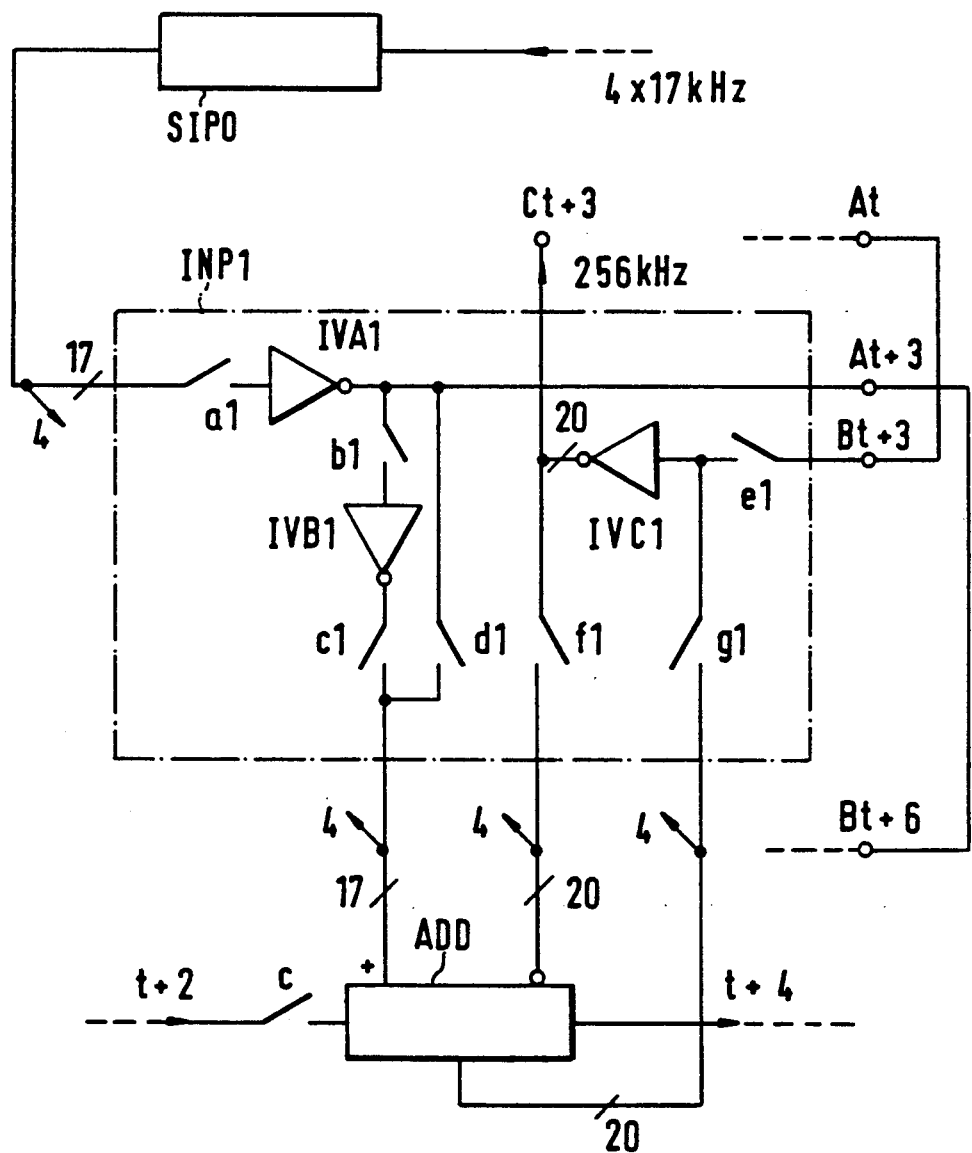
FIG. 1, a block diagram of a multiplex interpolator in accordance with the invention.

To be noted that in the preceding and following description i, i+1, ... and j, j+1, ... are subscripts.

FIG. 1 shows the essential elements of the new multiplex interpolator which can be used in a Digital Signal Processor of the general type disclosed in the above article concerning a digital codec and more particularly in the receive path of such a PCM telephone line circuit. As noted above, in this earlier realisation using a 3 micron CMOS technology, after a first interpolation from 8 to 32 kHz that from 32 to 256 kHz was based on the use of binary dividers now avoided by the new design usable in a 1.2 micron technology and in multiplex manner for 4 speech channels instead of for a single subscriber line circuit as in the above article. In the latter, the digital hybrid linking the receive to the transmit path and designed to cancel under software control the excess echo return signal that passes through the analog hybrid, was fed by the 32 kHz signals and with the 4 channels now being multiplexed, the 32 to 256 kHz interpolation in the receive path again takes place after the digital hybrid derivation. The interpolation from 8 to 32 kHz can, as in the above European patent application, transform the 13-bit into 17-bit words and apply them to the DC blocking circuit disclosed by that application and which is designed to output the words still in the 17-bit format and at 32 kHz but without a DC error component due to noise. As disclosed in that application this processing relies on the use of a rounding bit as the 17th LSB fractional part which is added to the integral part of the word constituted by 15 bits, i.e. all the remaining ones except the MSB constituting the sign bit. It may thus be assumed that 17-bit words are to be interpolated from 32 to 256 kHz as before but this time in multiplex fashion for 4 independent channels.

FIG. 1 represents an input serial to parallel converter SIPO with its input fed by a serial stream of bits at $4 \times 32 \times 32$ kHz the indication of of $4 \times 17$ on FIG. 1 reflecting the fact that only 17 out of $32 \times 32$ bits are useful ones. This Serial In Parallel Out converter produces parallel outputs on 17 conductors, as indicated by the slash reference on the single conductor shown, with the serial stream on each of the 17 conductors now being at $4 \times 32 = 128$ kHz The 17 bits of each word are thus processed in parallel using a bit slice structure with the LSB entering the SIPO first and with such a technology as 1.2 micron CMOS implying sufficiently fast carry propagation between adder stages. For each of the 17 bit "planes", FIG. 1 shows that each of the 17 conductors feeds 4 identical circuits in parallel, as indicated by the multipling arrow, with only the first (INPI) shown in detail and comprising various gates such as al, represented by open contacts, and logic inverters, used for bit storage on their input capacitance, such as IVA1. The four circuits such as INP1 are intercoupled with a parallel adder/subtractor ADD with one stage thereof associated with a corresponding bit plane out of the 17 so that input/output carry connections extend between these planes starting from the LSB. Subtraction is carried out on a two's complement basis.

With the circuits of FIG. 1 having to process 4 independent words at 32 kHz in multiplex fashion the various gates such as al in INPl are operated during predetermined time slots which are repeated in cycles of 128 consecutive time slots within a period of $1000/32 = 31.25$ microseconds so that 4 words can be simultaneously and independently processed at the interpolator input rate of 32 kHz while delivering 4 independent output words at $8 \times 32 = 256$ kHz.

FIG. 2 shows pulse waveforms defining these 128 time slots in a period of 31.25 microsecond and which are provided by a 7-stage binary counter (not shown) driven by clock pulses at $128 \times 32 = 4096$ kHz, and which may be reset periodically to avoid loss of synchronism with other circuits (not shown), so that the first stage of the counter produces the shown complementary square waveforms $\overline{A}$ and A having a period equal to twice that (244 nanosecond) of the driving clock pulses. In turn, the second stage outputs the $\overline{B}$ and B square waveforms at 4 times the input period and so on until the 7th stage producing the $\overline{G}$ and G square waveforms at a period of 31.25 microsecond. These 7 pairs of complementary binary pulse waveforms thus define 128 time slots of 244 nanosecond such as 0 during which $\overline{A}, \overline{B}, \overline{C}, \overline{D}, \overline{E}, \overline{F}, \overline{G}$ are simultaneously ON and 127 when this is true for A, B, C, D, E, F, G.

These various pulses are used to control the gates of FIG. 1 with the help of a 2-phase clock system at the 4096 kHz rate so that such u and v non-overlapping strobe pulses (not shown) reappear every 244 nanosecond, with u preceding v.

FIG. 3 shows a table linking the various control pulses to the various gates. The pulses are associated to the binary counter waveforms used to define the time slots and to u or v followed by a number from 0 to 127 corresponding to the time slots of FIG. 2. The gates reference letters are associated to their respective interpolator circuit INP1, 2, 3 or 4 of which only the first is shown in detail in FIG. 1. Thus, the table has 4 rows corresponding to these 4 interpolator circuits and 6 columns only for the gates a, b/e, c, d, f, g since b and e are operated in synchronism.

Jointly referring to FIGS. 1 to 3, it is now seen that the a and b gates, e.g. and a1 and b1 in INP1, are only conductive (closed contact) at the beginning of each distinct quarter period of 32 time slots in order that the a gates should latch the new incoming words Si+1 into IVA (input shunt capacitance) while the Si words previously stored therein are shifted into IVB through the b gates, this implying that the u strobe pulses are used for the latter step, i.e. before the v strobe pulses gate in Si+1. Thus, FIGS. 2 and 3 indicate that a1, 2, 3, 4 are ON during the occurence of v0, 32, 64, 96 and b1, 2, 3, 4 during u0, 32, 64, 96 respectively. After a full period of 128 time slots and equal to 31.25 microsecond the next word will be available from SIPO.

Simultaneously with the shift of Si into IVB through b, it will also be shifted through e into IVC used as accumulator for ADD, the latter acting in multiplex for INP1, 2, 3, 4 as indicated by the 4 multipling arrow. Thus, as confirmed by FIG. 3, b and e are operated in synchronism. Indeed, as shown by FIG. 1, the loading of Si from IVA into IVC occurs with a shift of 3 bits in such a way that actually 8 Si is stored into IVC, ouput terminal Ai+3 of IVA for the shown bit plane i+3 being connected to input terminal Bi+6 of IVB for bit plane i+6 while Al in bit plane i is connected to Bi+3.

The 4 series of input words ..., Si, Si+1, ... having thus been shown to be fed from SIPO into IVA1, 2, 3, 4 in staggered fashion on a continuous basis, the function of the remaining gates c, d, f and g will now be explained in connection with the processing of Si+1 latched into IVA, Si into IVB and 8Si into IVC in order to successively output in multiplex the 4 series of interpolated words 7Si+Si+1, 6Si+2Si+1, ..., Si+7-Si+1, 8Si+1. All these 4 remaining types of gates are again each using mutually exclusive time slots out of the 128 depending in which of INP1, 2, 3 or 4 such gates as c, d, f and g are located. But whereas the start of successive quarter periods of 32 time slots is used in connection with gates a, b and e, groups of 4 consecutive time slots are successively assigned to gates c, d, f and g in INP1, 2, 3 and 4, this being continuously repeated so that such gates can be operative 8 times during a period of 128 slots in order to output 8 interpolated words at 256 kHz. Thus 128/8=16 consecutive time slots would in principle be available for each of the 4 words interpolated in multiplex, i.e. 16/4=4 for each output word.

The gates f and g link the accumulator IVC to the adder/subtractor ADD, the latter used in multiplex, f from the output of IVC to the inverted input of ADD and g from the sum output of ADD to IVC.

As shown by FIGS. 2 and 3, f1 is ON during the occurrence of u2, 3, 18, 19, ..., 98, 99, 114, 115 since IVC1 must first be unloaded before a new word is latched therein from ADD, although both gates are successively operated by the non-overlapping u and v strobe pulses during the same indicated 16 time slots 2, 3, 18, 19, ..., 98, 99, 114, 115. The table of FIG. 3 indicates the 3 other series of 16 time slots involved for INP2, 3 and 4, i.e. for gates f/g2, 3 and 4.

The gates c and d link the positive input of ADD to either the output of IVB or IVA respectively, i.e. to admit either the previous $-S_i$ or the new $S_{i+1}$ input word.

The sign of the latter is reversed with respect to $S_i$, as required for the incrementation by the difference between the two, in view of a double logic inversion when passing 2's complement format (MSB used as sign bit, i.e. 0 for positive and 1 for negative, and 1's complement, i.e. inversion, becoming 2's complement by a +1 LSB carry input) words through IVA and IVB in cascade as opposed to one inversion through IVA only. Carrying out the subtraction of $S_{i+1}$ before the addition of $S_i$ means that no overflow circuitry is needed.

As shown by FIGS. 2 and 3, c1 is ON during the occurence of u2, 18, 34, 50, 66, 82, 98, 114 and d1 during u3, 19, 35, 51, 67, 83, 99, 115 and again, the use of such 8 successive pairs of consecutive time slots, e.g. 2 and 3, is also the case for the 3 other series of u pulses associated with c/d2, 3, 4 in INP 2, 3, 4 respectively and identified in the table of FIG. 3.

Together with the binary pulse waveforms of FIG. 2, the table shows that 16 consecutive time slots can cycle the C and D stages of the binary counter (not shown), defining the time slots, exactly through their 4 possible conditions with each of the 4 associated with one out of INP1, 2, 3 or 4, e.g. $\overline{CD}$ for INP1. But the 16 time slots, or 4 per word, are not all available for the operations needed to produce the 4 new interpolated output words since the adder/substractor ADD being used in multiplex for the 4 words it is necessary to initialize ADD prior to its use in connection with data for a different INP and this is achieved by using only half these available time slots, i.e. those associated with B.

On the other hand, those associated with $\overline{B}$ can conveniently be used for insertion of the new words through the a, b and e gates without any interference with the operations involving ADD since FIG. 3 shows that these gates are all controlled during $\overline{B}$ and not B time slots.

Thus, considering INP1, during time slot 2, u strobe pulses render gates c1 and f1 conductive so that ADD will compute the difference between $8S_i$ and $S_i$ to produce $7S_i$. This takes place in all bit planes so that the adder/subtractor stage ADD shown in FIG. 1 for bit i+3 is also fed with the binary carry from the previous i+2 stage and this through gate c which is conductive simultaneously with c1, 2, 3 and 4, i.e. during time slots 2, 6, 10, 14, 18, 22, 26, 30, ..., 114, 118, 122, 126 by controlling c only with $\overline{AB}$ and not by the C and D conditions. Such carries will also include an LSB carry input in order to obtain from the 1's complement, i.e. inversion, the 2's complement needed for subtraction. In addition to each ADD stage delivering its binary sum output through g, e.g. g1, enabled by a subsequent v strobe pulse also during time slot 2, its carry output is made available to the next i+4 stage. To be noted that words of 20 bits are in fact supplied from and to the accumulator IVC to and from ADD in view of $8S_i$ being stored by a shift of 3 bits.

FIG. 3 indicates, as previously mentioned, that gates e and g commoned at the input of IVC cannot lead to undesired interferences since they are made conductive during mutually excluding time slots $\overline{B}$ and B and that similarly this is true for gates c and d commoned at the + input of ADD, this time due to the mutually excluding time slots $\overline{A}$ and A.

Hence, considering INP1, during time slot 3, the u strobe pulse renders gates d1 and f1 simultaneously conductive so that ADD will now add $S_{i+1}$ to $7S_i$ to complete the iteration step, a v strobe pulse during this time slot again delivering the sum output from ADD through g1

After time slot 3, condition $\overline{CD}$ changes to $C\overline{D}$ so that INP2 can now become active in using ADD twice in the above described manner, a complete cycle of 128 consecutive time slots enabling to output 4×8 interpolated words each computed during 2 out of 4 consecutive time slots. The newly interpolated output word during time slots 2 and 3 will be effectively available at such terminals as $C_{i+3}$ of IVC1 only from time slot 6 because during the intervening time slots 4 and 5 (B condition). The word will remain available until the occurence of time slot 16 and likewise for all words so that there can be no interference with a new input word being fed into IVC1 during time slot 0.

This means that the 20-bit output words are available for further processing during 10 successive time slots out of a theoretical maximum of 16. During such time intervals, these demultiplexed 256 kHz output words can be transmitted to corresponding digital sigma-delta modulators such as disclosed in the above European patent application. Therein, the digital words can be further interpolated to 1-bit words at 1024 kHz.

While the principles of the invention have been described above in connection with specific apparatus, it is to be clearly understood that this description is made only by way of example and not as a limitation on the scope of the invention.

What is claimed is:

1. Interpolator for increasing the output word rate of a digital signal by interleaving words between successive input words ..., $S_i$, $S_{i+1}$, ... the values of the interleaved output words depending on the difference between successive input words, characterized in that the successive input words ..., $S_i$, $S_{i+1}$, ... feed a memory (INP) to store two consecutively applied input words $S_i$ (IVB) and $S_{i+1}$ (IVA) as well as multiplier means producing successively the words ..., $S_i$, $nS_{i+1}$, ... (IVC) where n is the multiplication factor, and the interpolator further includes an adder/subtractor (ADD) repeatedly operated N times during the period of time each pair of words $S_i$ and $S_{i+1}$ is stored to feed the output words into an accumulator (IVC) initially storing $nS_i$ provided by the multiplier means, the adder/subtractor inputs being fed by the output word in the acumulator and by words which are such predetermined functions of $S_i$ and $S_{i+1}$ in the memory that after the N repeated operations $nS_i+1$ is fed into the accumulator by the adder/subtractor.

2. A plurality p of interpolators (INP1) as claimed in claim 1, characterized in that they are associated in time division multiplex fashion in such a way that each period during which the adder/subtractor is operated N times is divided into p consecutive time intervals ($\overline{FG}$, $\overline{FG}$, $\overline{FG}$, FG) each of which being used to feed the corresponding p memories and p multiplier means, and that each such period is also divided into N consecutive time intervals and each of these being further divided into p consecutive time intervals ($\overline{CD}$, $\overline{CD}$, $\overline{CD}$, CD) each of the pN time intervals being used to operate the adder/subtractor after its initialization (B) to produce the corresponding one ($C_i+3$) of the N output words for the corresponding one (INP1) of the p interpolators.

3. Interpolator as claimed in claim 1, characterized in that the N operations of the adder/subtractor each consist in adding $S_i+1-S_i$ to the value stored in the accumulator.

4. Interpolator as claimed in claim 3, characterized in that adding $S_i+1-S_i$ to the value stored in the accumulator is carried out by the adder/subtractor in two consecutive steps, one involving only $S_i$ and the other only $S_i+1$.

5. Interpolator as claimed in claim 4, characterized in that the adder/subtractor first subtracts $S_i$.

6. Interpolator as claimed in claim 5, characterized in that the adder/subtractor is an algebraic adder fed by $-S_i$ from an inverter memory storing (IVB) $S_i$.

7. Interpolator as claimed in claim 1, characterized in that the input words are serially applied through a series to parallel converter (SIPO) with the bits of each word processed in parallel.

8. Interpolator as claimed in claim 1, characterized in that $n=N$.

9. A plurality p of interpolators as claimed in claim 2 $n=N$ characterized in that both p and N are powers of two.

10. A plurality of interpolators as claimed in claim 9, characterized in that each of the pN time intervals is divided into a number of consecutive time slots equal to a power of two.

11. A plurality p of interpolators as claimed in claim 10, characterized in that in each of the pN time intervals, one half (B) of consecutive time slots is used to operate the adder/subtractor and the other ($\overline{B}$) for its initialization.

12. A plurality p of interpolators as claimed in claim 11, characterized in that the feed of the p memories and of the p multiplier means takes place during the other half ($\overline{B}$) of the consecutive time slots.

13. Interpolator as claimed in claim 1, characterized in that the two's complement format is used for the input words.

* * * * *

UNITED STATES PATENT AND TRADEMARK OFFICE
CERTIFICATE OF CORRECTION

PATENT NO. : 5,191,545
DATED : March 2, 1993
INVENTOR(S) : J. Sevenhans et al It is certified that error appears in the above-identified patent and that said Letters Patent is hereby corrected as shown below:

At column 8, line 59, please change "Si" to --nSi--.

Signed and Sealed this

Twenty-third Day of November, 1993

*Attest:*

BRUCE LEHMAN

*Attesting Officer*     *Commissioner of Patents and Trademarks*